(12) United States Patent
Oh et al.

(10) Patent No.: US 10,720,278 B2
(45) Date of Patent: Jul. 21, 2020

(54) MULTILAYER CERAMIC CAPACITOR WITH DECREASED HIGH VOLTAGE STRESS DEFECTS AND BOARD HAVING THE SAME

(71) Applicant: SAMSUNG ELECTRO-MECHANICS CO., LTD., Suwon-si, Gyeonggi-do (KR)

(72) Inventors: Young Heon Oh, Suwon-si (KR); Se Hwan Bong, Suwon-si (KR); Young Ha Kim, Suwon-si (KR); Dong Gun Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/263,761

(22) Filed: Jan. 31, 2019

(65) Prior Publication Data

US 2019/0164691 A1 May 30, 2019

Related U.S. Application Data

(63) Continuation of application No. 15/258,438, filed on Sep. 7, 2016, now Pat. No. 10,319,520.

(30) Foreign Application Priority Data

Dec. 30, 2015 (KR) .................. 10-2015-0189439

(51) Int. Cl.
*H05K 1/18* (2006.01)
*H01G 4/005* (2006.01)
(Continued)

(52) U.S. Cl.
CPC ............ *H01G 4/005* (2013.01); *H01G 4/012* (2013.01); *H01G 4/228* (2013.01); *H01G 4/232* (2013.01);
(Continued)

(58) Field of Classification Search
CPC ...................................................... H05K 1/181
(Continued)

(56) References Cited

U.S. PATENT DOCUMENTS

2008/0186652 A1* 8/2008 Lee ...................... H01G 4/012
361/306.3
2010/0188799 A1* 7/2010 Galvagni ............... H01G 4/012
361/306.3
(Continued)

FOREIGN PATENT DOCUMENTS

JP 2002-184648 A 6/2002
JP 2004-047707 A 2/2004
(Continued)

OTHER PUBLICATIONS

Notice of Office Action dated Jan. 12, 2017, in corresponding Korean Application No. 10-2015-0189439, with English language translation.
(Continued)

*Primary Examiner* — Stanley Tso
(74) *Attorney, Agent, or Firm* — Morgan, Lewis & Bockius LLP

(57) ABSTRACT

A multilayer ceramic capacitor with decreased high voltage stress defects and a board having the same may include a body formed by stacking a plurality of dielectric layers and a plurality of first and second internal electrodes in a width direction, the first and second internal electrodes including body portions overlapping each other and lead portions exposed to a mounting surface of the body and disposed to be spaced apart from each other, respectively; and first to third external electrodes disposed on the mounting surface of the capacitor body to be connected to the lead portions,
(Continued)

respectively, wherein the body portions of the first and second internal electrodes have different areas from each other.

9 Claims, 11 Drawing Sheets

(51) Int. Cl.
  *H01G 4/30* (2006.01)
  *H01G 4/012* (2006.01)
  *H01G 4/232* (2006.01)
  *H01G 4/228* (2006.01)
  *H01G 4/12* (2006.01)
(52) U.S. Cl.
  CPC ............... *H01G 4/30* (2013.01); *H05K 1/181* (2013.01); *H01G 4/12* (2013.01); *H05K 2201/10015* (2013.01); *H05K 2201/10636* (2013.01); *Y02P 70/611* (2015.11)
(58) Field of Classification Search
  USPC ........................................................ 174/260
  See application file for complete search history.

(56) References Cited

U.S. PATENT DOCUMENTS

| | | |
|---|---|---|
| 2010/0321860 A1 | 12/2010 | Osawa |
| 2012/0162853 A1 | 6/2012 | Togashi |
| 2015/0090485 A1 | 4/2015 | Lee et al. |
| 2017/0148571 A1 | 5/2017 | Akada |
| 2018/0124904 A1* | 5/2018 | Cho ........................ H01G 4/002 |

FOREIGN PATENT DOCUMENTS

| | | |
|---|---|---|
| KR | 10-2008-0073193 A | 8/2008 |
| KR | 10-2015-0039090 A | 4/2015 |

OTHER PUBLICATIONS

Notice of Allowance issued in related U.S. Appl. No. 15/258,438 dated Jan. 30, 2019.
Non-Final Office Action issued in related U.S. Appl. No. 15/258,438 dated Oct. 22, 2018.
Final Office Action issued in related U.S. Appl. No. 15/258,438 dated Feb. 2, 2018.
Non-Final Office Action issued in related U.S. Appl. No. 15/258,438 dated Sep. 19, 2017.

* cited by examiner

II-II'

MULTILAYER CERAMIC CAPACITOR WITH DECREASED HIGH VOLTAGE STRESS DEFECTS AND BOARD HAVING THE SAME

CROSS-REFERENCE TO RELATED APPLICATION

This application is the continuation of U.S. application Ser. No. 15/258,438, filed Sep. 7, 2016, which claims the benefit of priority to Korean Patent Application No. 10-2015-0189439, filed on Dec. 30, 2015 with the Korean Intellectual Property Office, the entirety of which is incorporated herein by reference.

BACKGROUND

The present disclosure relates to a multilayer ceramic capacitor and a board having the same.

A multilayer ceramic capacitor (MLCC) has features such as a compact size, high capacitance, and ease of mountability.

The multilayer ceramic capacitor may be mounted on circuit boards of several electronic products such as display devices including liquid crystal displays (LCDs), plasma display panels (PDPs), and the like, computers, smartphones, mobile phones, and the like, to thereby serve to charge and discharge electricity.

In the multilayer ceramic capacitor as described above, a body is formed by stacking a plurality of dielectric layers and internal electrodes. The larger the numbers of stacked dielectric layers and internal electrodes in a multilayer body, the higher a probability that a step will be generated in a margin portion in which the internal electrode is not formed.

Where the step is generated as described above, when the multilayer body is compressed, both end portions of the internal electrodes in a length direction may be bent in order to fill an empty space of the multilayer body in which the step is formed.

Therefore, a thickness of both edge portions of the body in the length direction in which the end portions of the internal electrodes are positioned may become thinner than that of a central portion of the body, thereby causing defects such as short circuits and a high voltage stress (HVS) defect in the multilayer ceramic capacitor.

The HVS defect may cause a structural defect when performing a test that involves applying a voltage higher than a rated voltage in a short time period.

SUMMARY

An aspect of the present disclosure provides a multilayer ceramic capacitor capable of decreasing a step generated when a multilayer body is compressed, and a board having the same.

The multilayer ceramic capacitor may include a capacitor body formed by stacking a plurality of dielectric layers and a plurality of first and second internal electrodes in a width direction, the first and second internal electrodes including body portions overlapping each other and one or more lead portions exposed to a mounting surface of the capacitor body and disposed to be spaced apart from each other, respectively; and first to third external electrodes disposed on the mounting surface of the capacitor body to be connected to respective lead portions wherein the body portions of the first and second internal electrodes are formed to have different areas from each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
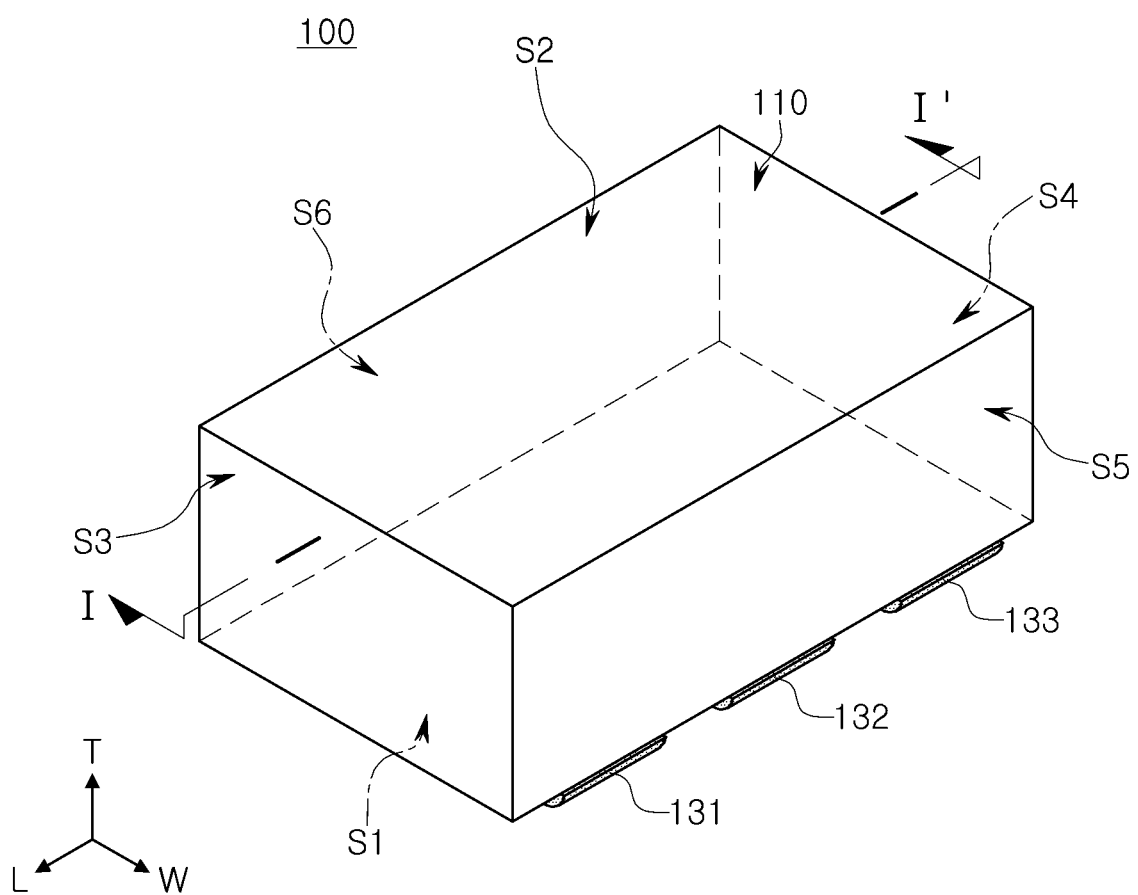
FIG. 1 is a perspective view schematically illustrating a multilayer ceramic capacitor according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to,"

or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers, and/or sections, these members, components, regions, layers, and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above" other elements, or "upper," would then be oriented "below" the other elements or features, or "lower." Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Directions of a hexahedron will be defined in order to clearly describe exemplary embodiments in the present disclosure. L, W, and T shown in the accompanying drawings refer to a length direction, a width direction, and a thickness direction, respectively.

Here, the width direction may be the same as a stacking direction in which dielectric layers are stacked.

Multilayer Ceramic Capacitor

Figure 2:
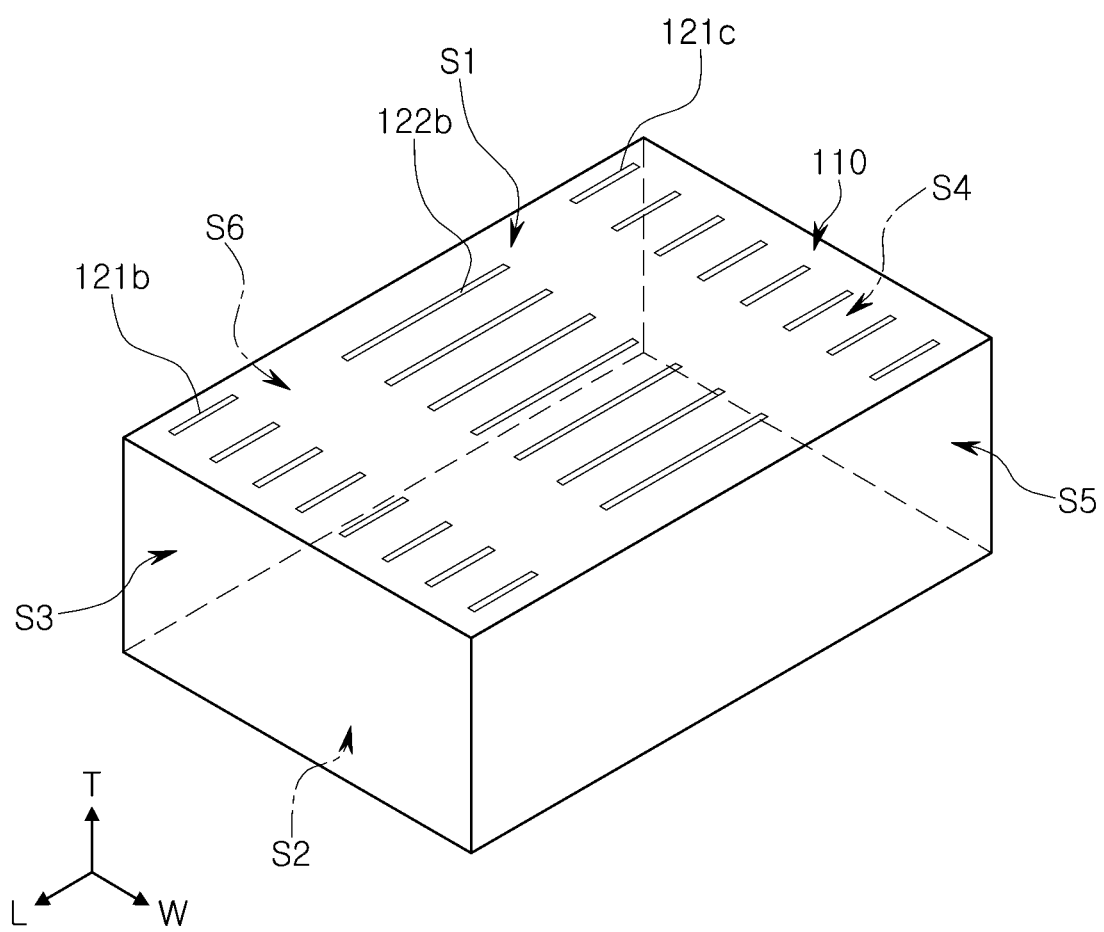
FIG. 2 is a perspective view illustrating a body of FIG. 1 so that a mounting surface thereof is directed upward.
Figure 3:
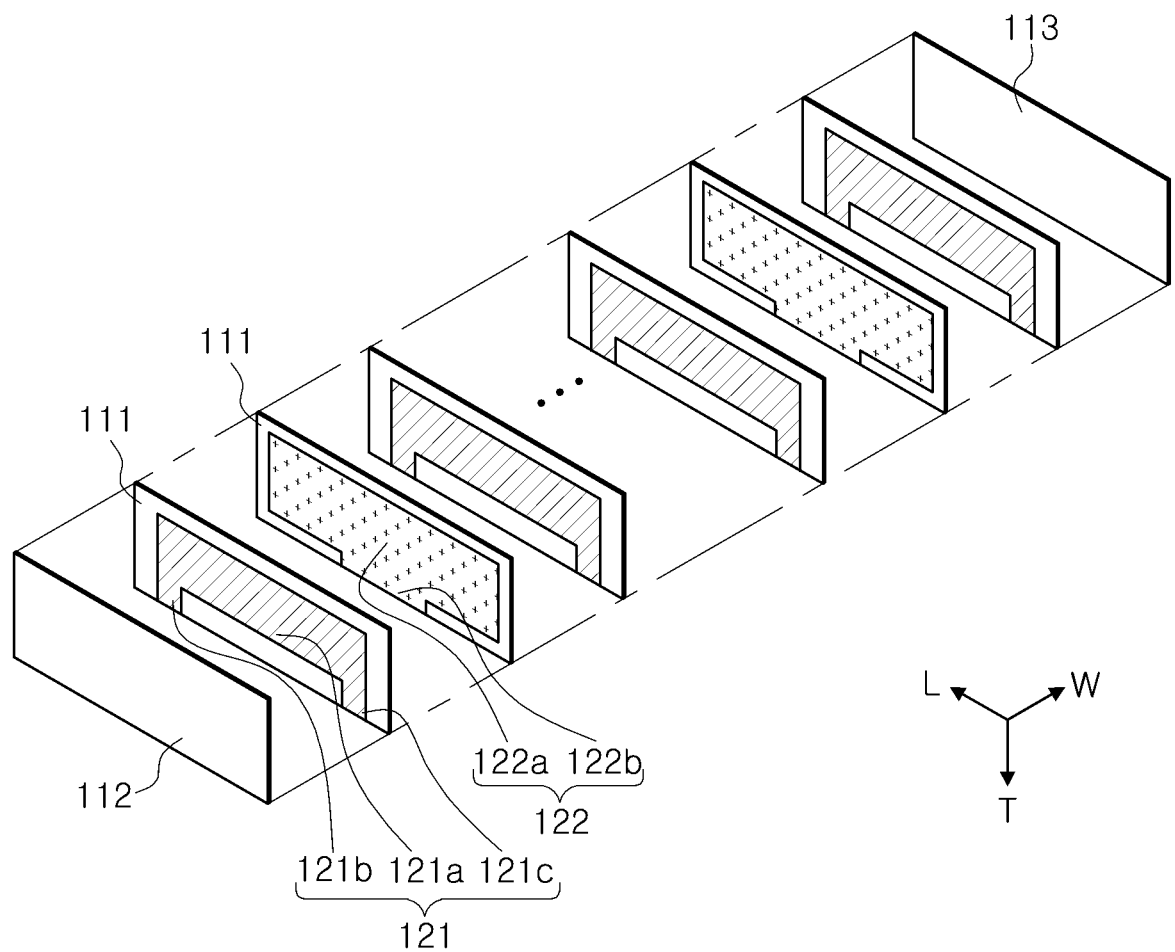
FIG. 3 is a separate perspective view illustrating a stacking structure of first and second internal electrodes of FIG. 1.
Figure 4:
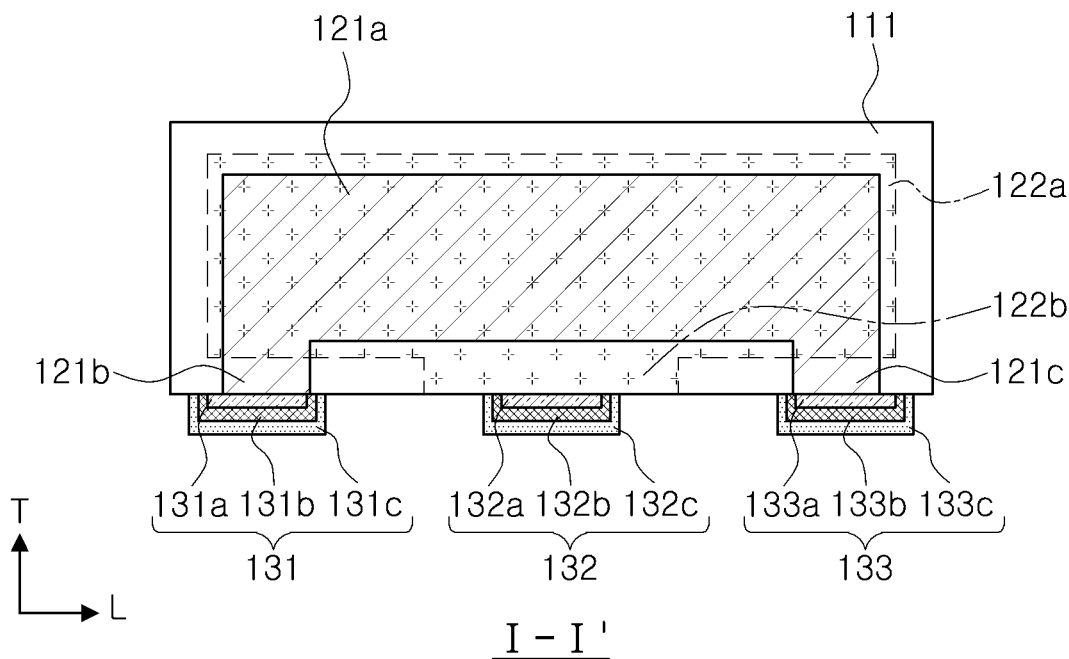
FIG. 4 is a cross-sectional view taken along line I-I' of FIG. 1.

FIG. 1 is a perspective view schematically illustrating a multilayer ceramic capacitor according to an exemplary embodiment in the present disclosure, FIG. 2 is a perspective view illustrating a body of the multilayer ceramic capacitor shown in FIG. 1 so that amounting surface thereof is directed upward, FIG. 3 is a separate perspective view illustrating a stacking structure of first and second internal electrodes of the multilayer ceramic capacitor shown in FIG. 1, and FIG. 4 is a cross-sectional view taken along line I-I' of FIG. 1.

Referring to FIGS. 1 through 4, a multilayer ceramic capacitor 100 according to the present exemplary embodiment may include a body 110 and first to third external electrodes 131 to 133.

The body 110 may include a plurality of dielectric layers 111 stacked in the width direction and a plurality of first and second internal electrodes 121 and 122 alternately disposed in the width direction with dielectric layers 111 interposed therebetween.

The body 110 may be formed by stacking the plurality of dielectric layers 111 and the first and second internal electrodes 121 and 122 in the width direction and sintering the stacked dielectric layers and internal electrodes, and a shape of the body 110 is not particularly limited, but may have a substantially hexahedral shape as illustrated.

In this case, the body 110 may have first and second surfaces S1 and S2 opposing each other in the thickness (T) direction, third and fourth surfaces S3 and S4 connecting the first and second surfaces S1 and S2 to each other and opposing each other in the length (L) direction, and fifth and sixth surfaces S5 and S6 opposing each other in the width (W) direction.

Hereinafter, in the present exemplary embodiment, a description will be provided with a mounting surface of the multilayer ceramic capacitor 100 being the first surface S1 of the body 110.

The dielectric layers 111 may be in a sintered state, and adjacent dielectric layers 111 may be integrated with each other so that boundaries therebetween are not readily apparent without a scanning electron microscope (SEM).

In this case, a thickness of the dielectric layer 111 may be suitably changed according to a capacitance design of the multilayer ceramic capacitor 100. Further, the dielectric layer 111 may contain ceramic powder having high permittivity, such as a barium titanate ($BaTiO_3$) based powder, a strontium titanate ($SrTiO_3$) based powder, magnesium titanate, or the like, but the material of the dielectric layer 111 is not limited thereto as long as sufficient capacitance may be obtained.

In addition, if necessary, at least one of a ceramic additive, an organic solvent, a plasticizer, a binder, a dispersant, and the like, may be further added to the dielectric layer 111 together with the ceramic powder.

Further, covers 112 and 113 may be respectively disposed on the outermost portions of the body 110 in the width direction as margins.

The covers 112 and 113 may have the same material and configuration as those of the dielectric layer 111 except that internal electrodes are not included therein.

The covers 112 and 113 may be formed by stacking one or two or more dielectric layers on the outermost portions of the body 110 in the width direction, respectively, and may generally serve to prevent the first and second internal electrodes 121 and 122 from being damaged by physical or chemical stress.

The first and second internal electrodes 121 and 122, which are electrodes applied with different polarities, may be alternately disposed in the body 110 with dielectric layers 111 interposed therebetween in the width direction.

The first and second internal electrodes 121 and 122 may be electrically insulated from each other by the dielectric layers 111 interposed therebetween.

A material forming the first and second internal electrodes 121 and 122 is not particularly limited. For example, the first and second internal electrodes 121 and 122 may be formed using a conductive paste formed of at least one among a noble metal material such as palladium (Pd), a palladium-silver (Pd—Ag) alloy, or the like, nickel (Ni), and copper (Cu).

A printing method for the conductive paste may be a screen printing method, a gravure printing method, or the like, but the present disclosure is not limited thereto.

The first and second internal electrodes 121 and 122 according to the present exemplary embodiment may be disposed to be spaced apart from the third and fourth surfaces S3 and S4 of the body 110 by a predetermined distance, and margins in the length direction may be formed in the body 110 in accordance with a spaced distance.

The first internal electrode 121 may include a first body portion 121a overlapping a second body portion 122a of the second internal electrode 122 disposed adjacent thereto in the width direction to contribute to forming capacitance, and first and second lead portions 121b and 121c extended from the first body portion 121a to thereby be exposed to the first surface S1 of the body 110.

The first and second lead portions 121b and 121c may be disposed to be spaced apart from each other in the length direction of the body 110 and contact the first and third external electrodes 131 and 133 to thereby be electrically connected thereto, respectively.

The second internal electrode 122 may include a second body portion 122a overlapping the first body portion 121a of the first internal electrode 121 disposed adjacent thereto in the width direction to contribute to forming capacitance, and a third lead portion 122b extended from the second body portion 122b to thereby be exposed to the first surface S1 of the body 110.

The third lead portion 122b may be disposed between the first and second lead portions 121b and 121c in the length direction of the body 110 and may contact the second external electrode 132 to thereby be electrically connected thereto.

Since the first and second lead portions 121b and 121c of the first internal electrode 121 and the third lead portion 122b of the second internal electrode are disposed on the first surface S1 of the body 110 to be maximally adjacent to each other, the multilayer ceramic capacitor 100 according to the present exemplary embodiment may have low ESL.

An area of the second body portion 122a may be different from that of the first body portion 121a. While the second body portion 122a is illustrated with a larger area than the first body portion 121a, the present disclosure is not limited thereto and the first body portion 121a may have an area larger than that of the second body portion 122a.

In the present exemplary embodiment, the second body portion 122a may have an area larger than that of the first body portion 121a by forming the second body portion 122a to have a length longer than that of the first body portion 121a and a height greater than that of the first body portion 121a.

Where the areas of the first and second body portions 121a and 122a are different from each other, the position of the step may be changed from an upper portion of the body 110 to a lower portion thereof. In general, when a high voltage is applied to a multilayer ceramic capacitor, a defect such as an HVS defect may occur in end portions of internal electrodes in which a step is generated. When the position of the step is changed from the upper portion of the body to the lower portion, the HVS defect may be decreased.

According to the present exemplary embodiment, a current may flow from the first and third external electrodes 131 and 133 to the second external electrode 132. Since area distribution of a current loop, which is the shortest distance on the internal electrodes in which the current of the multilayer ceramic capacitor flows, is decreased by the structure as described above, ESL may be additionally further decreased as compared to a structure in which areas of first and second body portions are the same.

Figure 5:
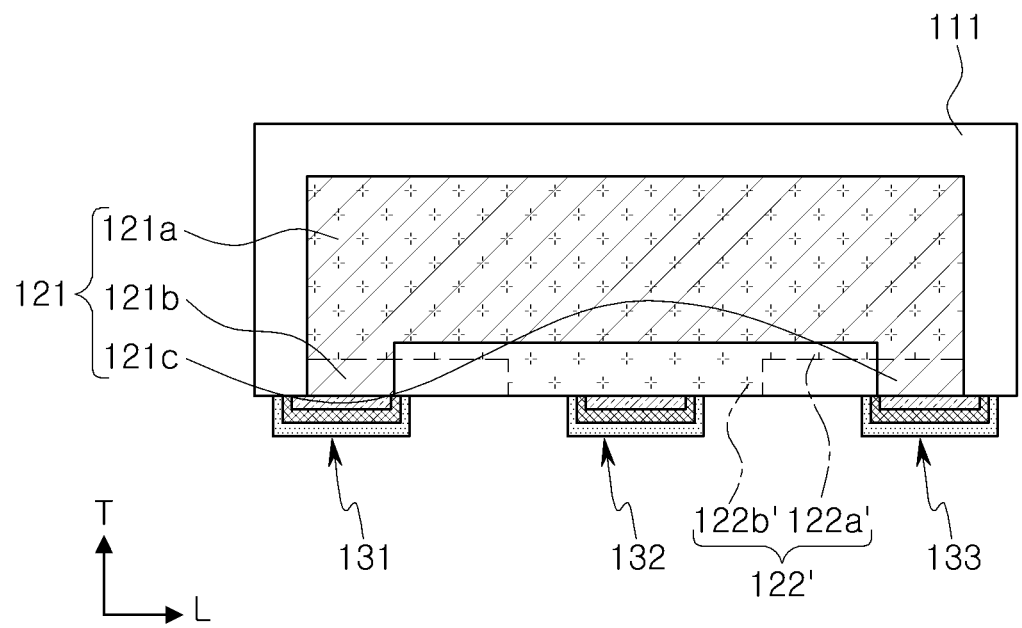
FIG. 5 is a cross-sectional view illustrating the first and second internal electrodes of FIG. 1 according to another exemplary embodiment.

The first and second body portions 121a and 122a are not limited to that embodiment, and as illustrated in FIG. 5, the second body portion 122a' may have the same length as that of the first body portion 121a and have a height greater than that of the first body portion 121a.

In this case, the second body portion 122a' may be expanded so that its height in a direction away from the mounting surface is the same as that of the first body portion 121a, but its height in a direction toward the mounting surface of the body 110 is larger than the first body portion 121a.

The structure as described above results in a smaller decrease to the an HVS defect rate, but permits an increased margin of the dielectric layer 11 in the length direction and an increased upper margin in the thickness direction, which may advantageously decrease a cutting defect rate and improve reliability.

Figure 7:
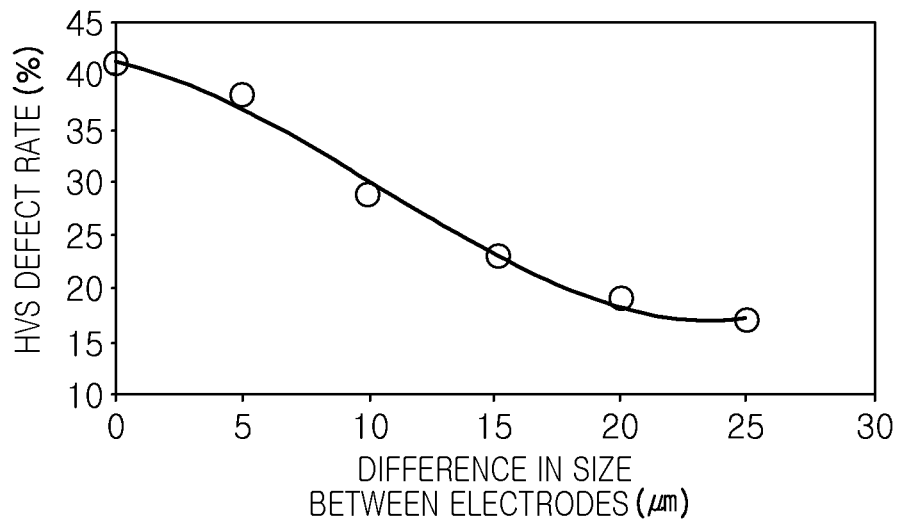
FIG. 7 is a graph illustrating an HVS defect rate depending on a difference in size between internal electrodes of a multilayer ceramic capacitor according to the present disclosure.
Figure 8:
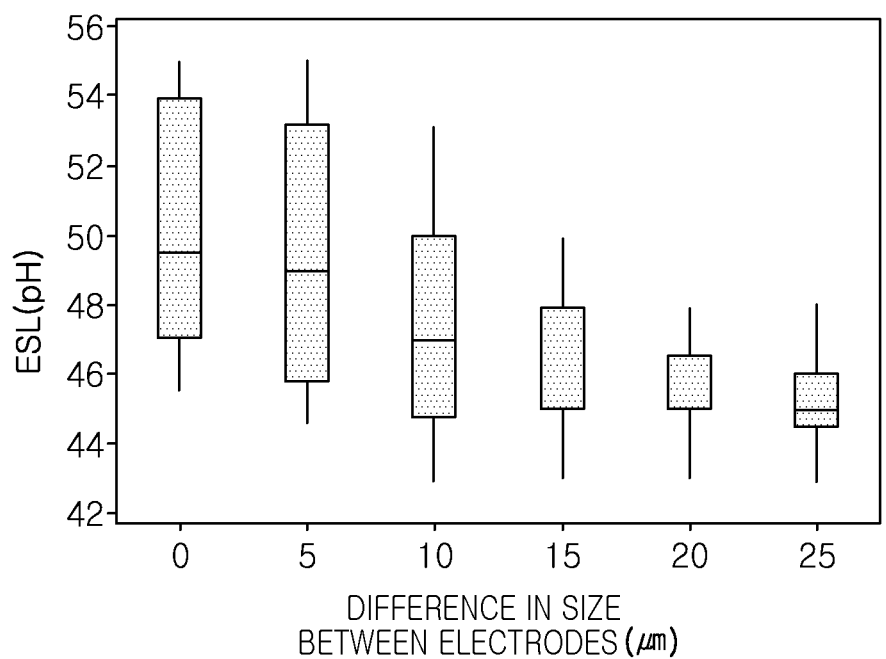
FIG. 8 is a graph illustrating equivalent series inductance (ESL) depending on the difference in size between internal electrodes of the multilayer ceramic capacitor according to the present disclosure.

FIG. 7 is a graph illustrating an HVS defect rate depending on a difference in size between internal electrodes of a multilayer ceramic capacitor according to the present disclosure, and FIG. 8 is a graph illustrating equivalent series inductance (ESL) depending on the difference in size between internal electrodes of the multilayer ceramic capacitor according to the present disclosure.

The following Table 1 illustrates the results of FIG. 7 in more detail. Hereinafter, the HVS defect rate, a cutting defect rate, and a change in ESL depending on the difference in size between the internal electrodes according to the present disclosure will be described with reference to Table 1 and FIGS. 7 and 8.

TABLE 1

| No. | Difference in Each Length and Width between First and Second Internal Electrodes (μm) | HVS Defect Rate (%) | Cutting Defect Rate (%) |
|---|---|---|---|
| 1 | 0 | 41 | 5.1 |
| 2 | 5 | 38 | 5.2 |
| 3 | 10 | 29 | 6.4 |
| 4 | 15 | 24 | 7.2 |
| 5 | 20 | 21 | 8.5 |
| 6 | 25 | 18 | 11.4 |
| 7 | 30 | 17 | 25.8 |
| 8 | 35 | 15 | 27.8 |
| 9 | 40 | 15 | 32.5 |
| 10 | 45 | 14 | 48.5 |
| 11 | 50 | 16 | 55.2 |

In this case, the size of the multilayer ceramic capacitor was 2.0×1.2×1.0 mm (length×width×thickness), the thickness of the first and second internal electrodes was 0.5 μm, the thickness of the dielectric layers was 0.9 μm, and the number of stacked first and second internal electrodes was 800. The difference in each width and length between the first and second internal electrodes was limited to 50 μm, at which point the HVS defect rate was saturated.

Referring to Table 1 and FIG. 7, in sample 1, in which there was no difference in each length and width between the first and second internal electrodes, the HVS defect rate was more than 40%. As shown in Table 1 and FIG. 7, as the difference in each length and width between the first and second internal electrodes was increased by 5 μm, the HVS defect rate was gradually decreased.

In sample 11, in which the difference in each length and width between the first and second internal electrodes was 50 μm or more, the cutting defect rate was more than 50%, the basis for determining a good product. Therefore, it may be preferable that the difference in each length and width between the first and second internal electrodes is less than 50 μm. In addition, more preferably, the difference in each length and width between the first and second internal electrodes may be in a range of 25 μm or less in which the cutting defect rate was not over 20% (samples 1 to 6).

In general, when first and second internal electrodes are stacked in a multilayer ceramic capacitor in a zigzag form, an increase and distribution of current loop may be generated.

Referring to FIG. 8, as the difference in area between the first and second body portions was increased, an ESL value was decreased, and distribution of ESL (a length of a vertical line) was also decreased. Here, a middle horizontal line of a bar graph indicates an average value.

Referring to FIG. 4, the first to third external electrodes 131 to 133 may be sequentially disposed on the first surface S1 of the body 110 to be spaced apart from each other in the length direction of the body 110.

Further, the first to third external electrodes 131 to 133 may be disposed to be spaced apart from the third and fourth surfaces S3 and S4 of the body 110.

The first to third external electrodes 131 to 133 may respectively include conductive layers 131a to 133a formed on the first surface S1 of the body 110, and plating layers respectively formed on the conductive layers 131a to 133a, wherein the plating layers may include nickel (Ni) plating layers 131b to 133b and tin (Sn) plating layers 131c to 133c respectively formed on the nickel (Ni) plating layers 131b to 133b.

Since, in a general multilayer ceramic capacitor, external electrodes are disposed on both ends of a body opposing each other in a length direction of the body, when applying an alternating current to the external electrodes, a current path is long, and thus a current loop is large, which may increase the size of the induced electric field, thereby causing an increase in inductance of an electronic component.

In the present exemplary embodiment, since the first to third external electrodes 131 to 133 are disposed on the first surface S1 of the body 110, a current path may be shortened, and thus, the current loop may be decreased, thereby decreasing inductance of an electronic component.

Figure 6:
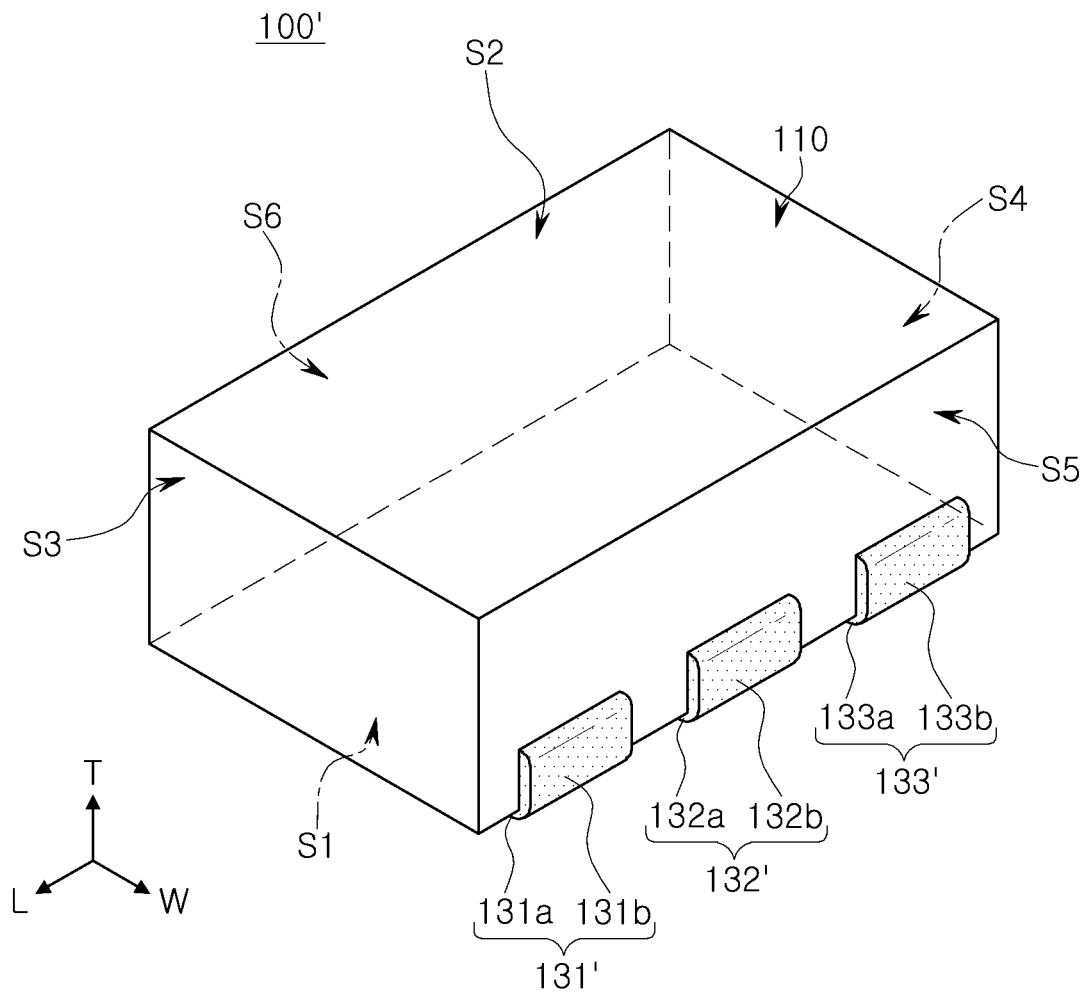
FIG. 6 is a perspective view illustrating the external electrodes of FIG. 1 according to another exemplary embodiment.

As illustrated in FIG. 6, first to third external electrodes 131' to 133' of a multilayer ceramic capacitor 100' may respectively include connection portions 131a to 133a formed on a first surface S1 of a body 110, and first to third band portions 131b to 133b extended from the connection portions 131a to 133a to portions of fifth and sixth surfaces S5 and S6 of the body 110, thereby improving adhesion strength of the first to third external electrodes 131' to 133'.

Modified Exemplary Embodiment

Figure 9:
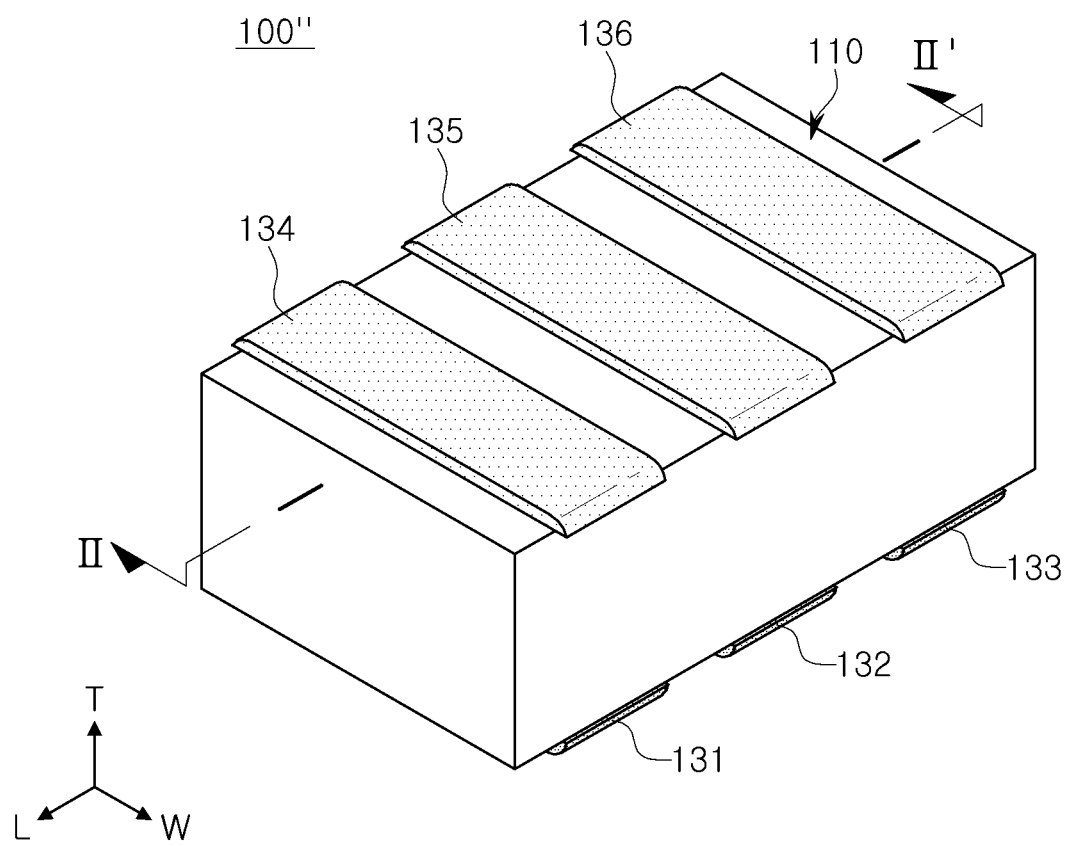
FIG. 9 is a perspective view illustrating a multilayer ceramic capacitor according to another exemplary embodiment in the present disclosure.
Figure 10:
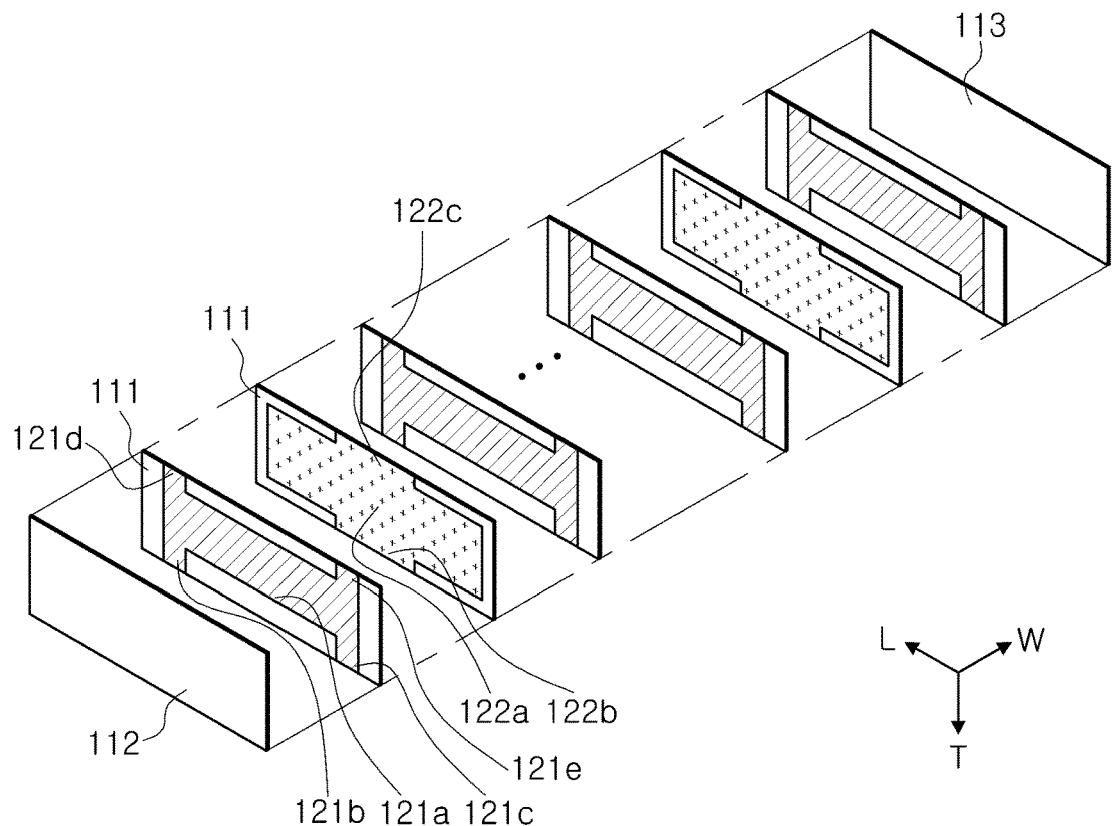
FIG. 10 is a separate perspective view illustrating a stacking structure of first and second internal electrodes of the embodiment shown in FIG. 9.
Figure 11:
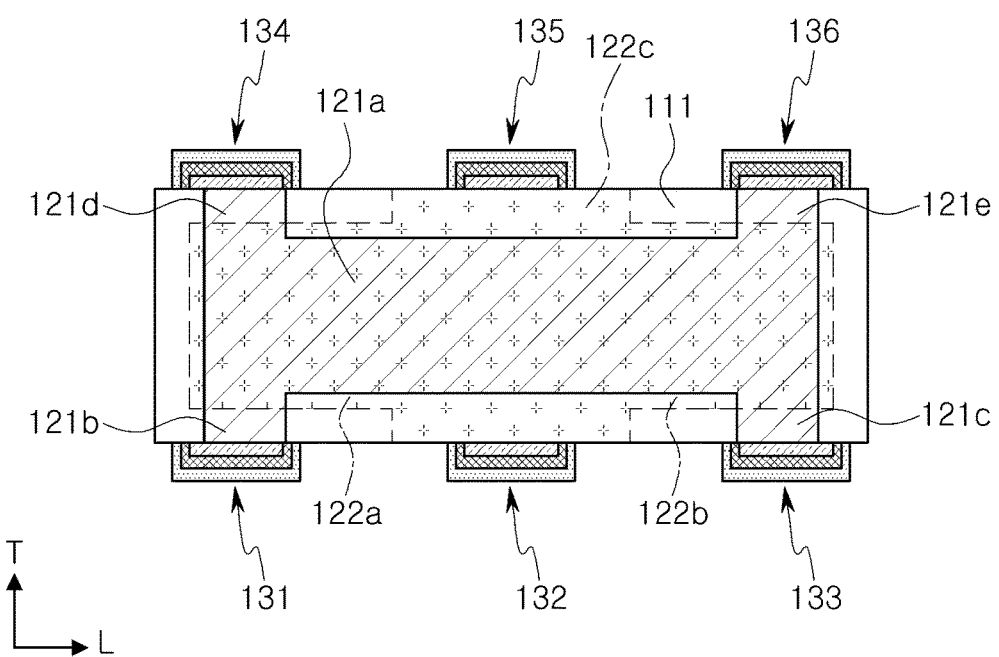
FIG. 11 is a cross-sectional view taken along line II-II' of FIG. 9.

FIG. 9 is a perspective view illustrating a multilayer ceramic capacitor according to another exemplary embodiment in the present disclosure, FIG. 10 is a separate perspective view illustrating a stacking structure of first and second internal electrodes of FIG. 9, and FIG. 11 is a cross-sectional view taken along line II-II' of FIG. 9.

A description of the same portions as those in the exemplary embodiment described above will be omitted in order to prevent an overlapping description, but first and second internal electrodes and fourth to sixth external electrodes having different structures from those in the exemplary embodiment described above will be described in detail.

Referring to FIGS. 9 through 11, a multilayer ceramic capacitor 100" according to the present exemplary embodiment may include fourth to sixth external electrodes disposed on a second surface S2 of a body 110.

The fourth to sixth external electrodes 134 to 136 may be sequentially disposed to be spaced apart from each other in a length direction of the body 110.

The fourth to sixth external electrodes 134 to 136 may be disposed to be spaced apart from third and fourth surfaces S3 and S4 of the body 110.

Further, the fourth to sixth external electrodes 134 to 136 may respectively include conductive layers formed on the second surface S2 of the body 110 and plating layers formed on the conductive layers.

The plating layers may include nickel (Ni) plating layers and tin (Sn) plating layers formed on the nickel (Ni) plating layers.

The first internal electrode 121 may include fourth and fifth lead portions 121d and 121e extended from the first body portion 121a to thereby be exposed to the second surface S2 of the body 110, respectively.

The fourth and fifth lead portions 121d and 121e may be disposed to be spaced apart from each other in the length direction of the body 110 and contact the fourth and sixth external electrodes 134 and 136 to thereby be electrically connected thereto, respectively.

The second internal electrode 122 may include a sixth lead portion 122c extended from a second body portion 122a to thereby be exposed to the second surface S2 of the body 110.

The sixth lead portion 122c may be disposed between the fourth and fifth lead portions 121d and 121e in the length direction of the body 110 and may contact the fifth external electrode 135 to thereby be electrically connected thereto.

When the internal and external electrodes of the multilayer ceramic capacitor 100" are formed to have vertically symmetrical structures as described above, directionality of the capacitor may be removed.

Therefore, since any surface of the first and second surfaces S1 and S2 of the multilayer ceramic capacitor 100' may be provided as a mounting surface, at the time of mounting the multilayer ceramic capacitor 100" on a circuit board, there is no need to consider a direction of the mounting surface.

Figure 12:
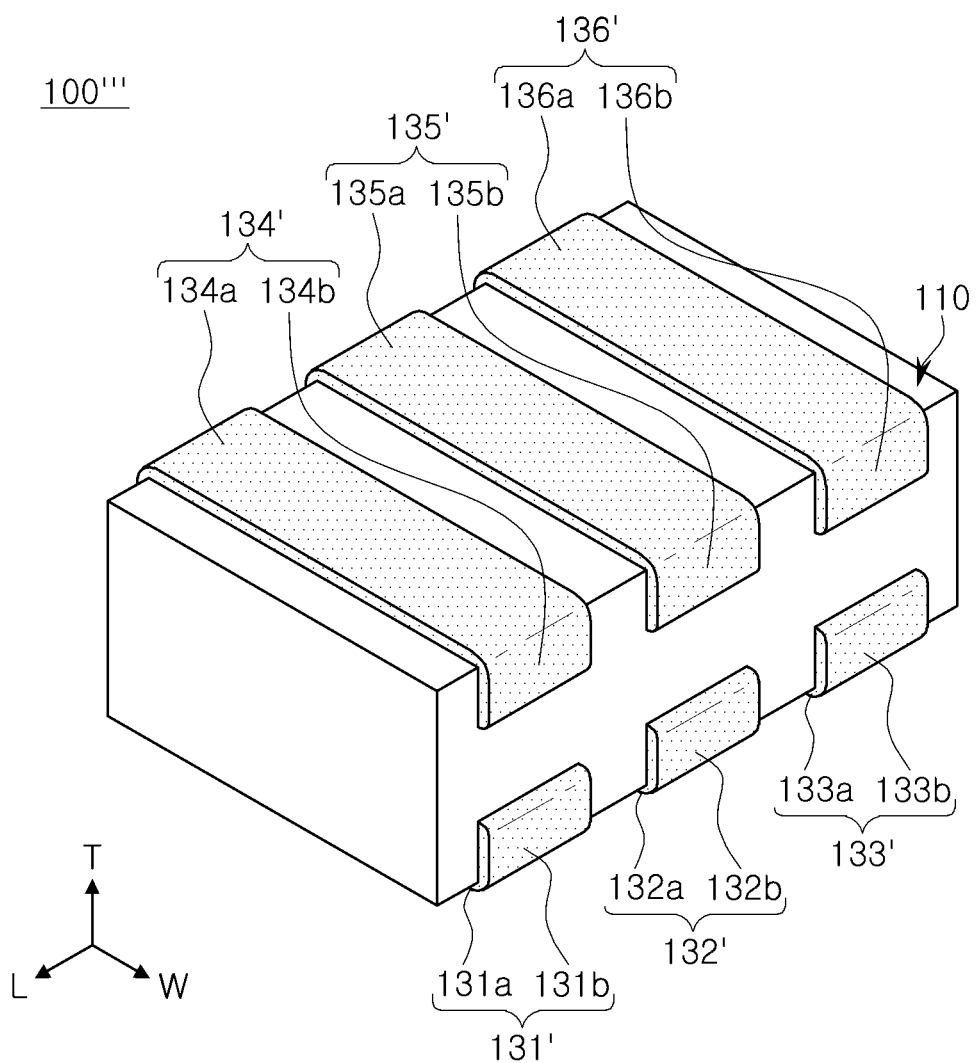
FIG. 12 is a perspective view illustrating the external electrodes of FIG. 9 according to another exemplary embodiment.

Referring to FIG. 12, fourth to sixth external electrodes 134' to 136' of a multilayer ceramic capacitor 100''' may include connection portions 134a to 136a formed on a second surface S2 of a body 110, and fourth to sixth band portions 134b to 136b extended from the connection portions 134a to 136a to portions of fifth and sixth surfaces S5 and S6 of the body 110, respectively. Therefore, adhesion strength of the fourth to sixth external electrodes 134' to 136' may be improved.

Board Having Multilayer Ceramic Capacitor

Figure 13:
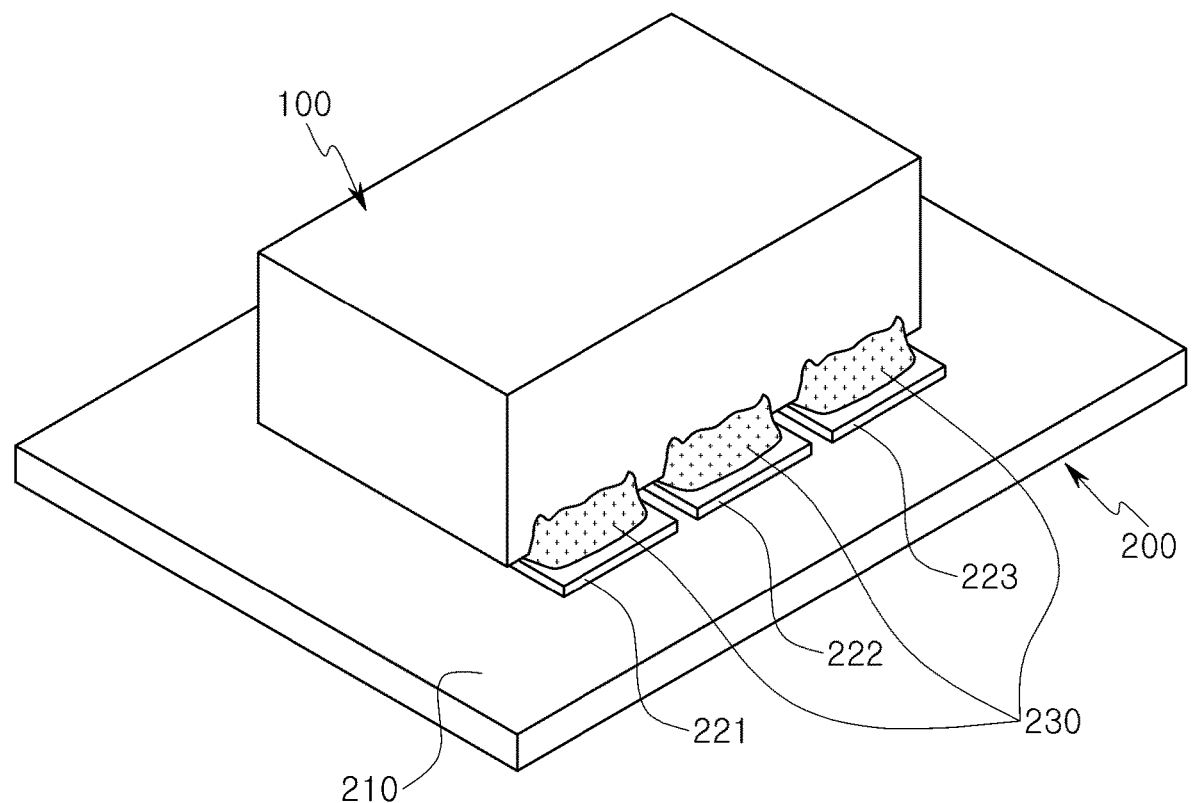
FIG. 13 is a perspective view illustrating the multilayer ceramic capacitor of FIG. 1 mounted on a circuit board.

FIG. 13 is a perspective view illustrating the multilayer ceramic capacitor of FIG. 1 mounted on a circuit board.

Referring to FIG. 13, a board 200 having a multilayer ceramic capacitor 100 according to the present exemplary embodiment may include a circuit board 210 on which the multilayer ceramic capacitor 100 is mounted, and first to third electrode pads 221 to 223 formed on the circuit board 210 to be spaced apart from each other.

The multilayer ceramic capacitor 100 may be electrically connected to the circuit board 210 by solder 230 in a state in which first to third external electrodes 131 to 133 are positioned to contact the first to third electrode pads 221 to 223, respectively.

Although the board in which the multilayer ceramic capacitor of FIG. 1 is mounted on the circuit board is illustrated in the present exemplary embodiment, the board is not limited thereto.

Figure 14:
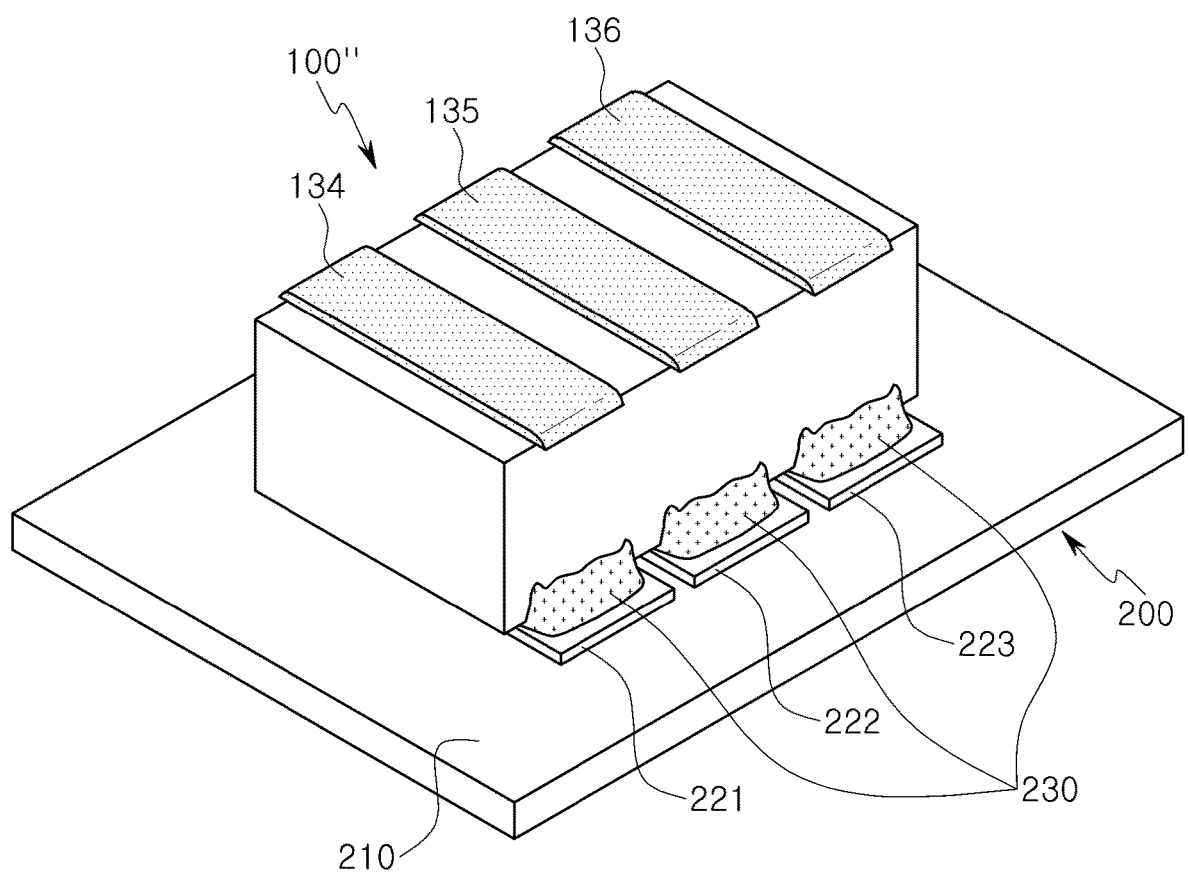
FIG. 14 is a perspective view illustrating the multilayer ceramic capacitor of FIG. 9 mounted on a circuit board.

As an example, a board having a multilayer ceramic capacitor may be configured by mounting the multilayer ceramic capacitor illustrated in FIG. 9, or the like, on a circuit board in a similar structure, as illustrated in FIG. 14.

As set forth above, according to exemplary embodiments in the present disclosure, the position in which the step is generated may be alternately changed from the upper portion of the body to the lower portion thereof by allowing the body portions of the internal electrodes to have different areas from each other, whereby the high voltage stress (HVS) defect in the end portions of the internal electrodes may be decreased.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
a body including a plurality of dielectric layers stacked therein in a width direction and a plurality of first and second internal electrodes alternately disposed therein with dielectric layers interposed therebetween; and
first to third external electrodes disposed on a mounting surface of the body and spaced apart from each other in a length direction of the body,
wherein the first internal electrodes each include a first body portion and first and second lead portions extended from the first body portion, exposed to the mounting surface of the body, spaced apart from each other in the length direction of the body, and connected to the first and third external electrodes, respectively,
the second internal electrodes each include a second body portion overlapping the first body portion and a third lead portion extended from the second body portion, exposed to the mounting surface of the body, disposed between the first and second lead portions, and connected to the second external electrode,
at least one first internal electrode is disposed directly between two second internal electrodes,
at least one second internal electrode is disposed directly between two first internal electrodes,
each of the first and second internal electrodes is spaced apart from both end surfaces of the body in the length direction,
wherein cross-sectional areas of the body portions of one of the first or second internal electrodes are greater than 100% and 105% or less of cross-sectional areas of the body portions of the other of the first or second internal electrodes, respectively,
wherein the body portions of one of the first or second internal electrodes are formed to be wider in length and thickness directions of the body than the body portions of the other of the first or second internal electrodes, and
wherein the multilayer ceramic capacitor further comprises fourth to sixth external electrodes disposed on a surface of the body opposing the mounting surface thereof and spaced apart from each other in the length direction of the body,
wherein the first internal electrode includes fourth and fifth lead portions extended from the first body portion, exposed to the surface of the body opposing the mounting surface thereof, and respectively connected to the fourth and sixth external electrodes, and
the second internal electrode includes a sixth lead portion extended from the second body portion, exposed to the surface of the body opposing the mounting surface of the body, and connected to the fifth external electrode.

2. The multilayer ceramic capacitor of claim 1, wherein the body portions of one of the first or second internal electrodes are formed to be wider in a direction toward the mounting surface of the body than the body portions of the other of the first or second internal electrodes.

3. The multilayer ceramic capacitor of claim 1, wherein the first to third external electrodes are spaced apart from both end surfaces of the body in the length direction.

4. The multilayer ceramic capacitor of claim 1, wherein the first to third external electrodes extend from the mounting surface of the body to portions of both side surfaces of the body in the width direction, respectively.

5. The multilayer ceramic capacitor of claim 1, wherein the fourth and sixth external electrodes are spaced apart from both end surfaces of the body in the length direction.

6. The multilayer ceramic capacitor of claim 1, wherein the fourth to sixth external electrodes extend from the surface of the body opposing the mounting surface thereof to portions of both side surfaces of the body in the width direction.

7. A board having a multilayer ceramic capacitor comprising:
a circuit board including first to third electrode pads; and
the multilayer ceramic electronic component of claim 1 mounted on the circuit board so that the first to third external electrodes are disposed on the first to third electrode pads, respectively.

8. The multilayer ceramic capacitor of claim 1, wherein a difference in each of length and width between the first and second internal electrodes is 50 μm or less and greater than 0 μm.

9. The multilayer ceramic capacitor of claim 1, wherein a difference in each of length and width between the first and second internal electrodes is 25 μm or less and greater than 0 μm.

* * * * *